United States Patent [19]

Sugimoto

[11] Patent Number: 5,222,500

[45] Date of Patent: Jun. 29, 1993

[54] MAGNETIC RESONANCE IMAGING METHOD AND APPARATUS FOR THE SAME

[75] Inventor: Hiroshi Sugimoto, Tochigi, Japan

[73] Assignee: Kabushiki Kaisha Toshiba, Tokyo, Japan

[21] Appl. No.: 719,164

[22] Filed: Jun. 21, 1991

[30] Foreign Application Priority Data

Jun. 22, 1990 [JP] Japan .................................. 2-164644

[51] Int. Cl.⁵ ................................................ A61B 5/055
[52] U.S. Cl. ................................. 128/653.2; 128/653.3
[58] Field of Search ........................ 128/653.2, 653.3; 324/309, 306

[56] References Cited

U.S. PATENT DOCUMENTS

| | | | |
|---|---|---|---|
| 4,532,473 | 7/1985 | Wehrli | 128/653.3 |
| 4,574,239 | 3/1986 | Singer | 128/653.3 |
| 4,574,240 | 3/1986 | Libove et al. | 128/653.3 |
| 4,707,658 | 11/1987 | Frahm et al. | 128/653.2 |
| 4,843,322 | 6/1989 | Glover | 324/309 |
| 4,845,430 | 7/1989 | Nakabayashi | 324/309 |
| 4,847,559 | 7/1989 | Keren | 324/309 |
| 4,947,837 | 8/1990 | Sano et al. | 324/309 |
| 5,016,637 | 5/1991 | Koizumi et al. | 324/309 |
| 5,111,820 | 5/1992 | Axel et al. | 128/653.2 |

Primary Examiner—Lee S. Cohen
Assistant Examiner—Krista M. Pfaffle
Attorney, Agent, or Firm—Limbach & Limbach

[57] ABSTRACT

A magnetic resonance imaging apparatus disclosed by this invention has a magnet assembly including a static magnetic field coil, a gradient magnetic field coil, an excitation coil, and a detection coil. A magnetic resonance signal detected by the detection coil is subjected to image reconstructing processing to obtain an image. The excitation coil can generate an exciting radio frequency pulse magnetic field for causing magnetic resonance excitation of a plurality of regions of an object to be examined simultaneously. Such an exciting radio frequency pulse magnetic field is formed by a mixed carrier having a plurality of carriers of different center frequencies.

21 Claims, 19 Drawing Sheets

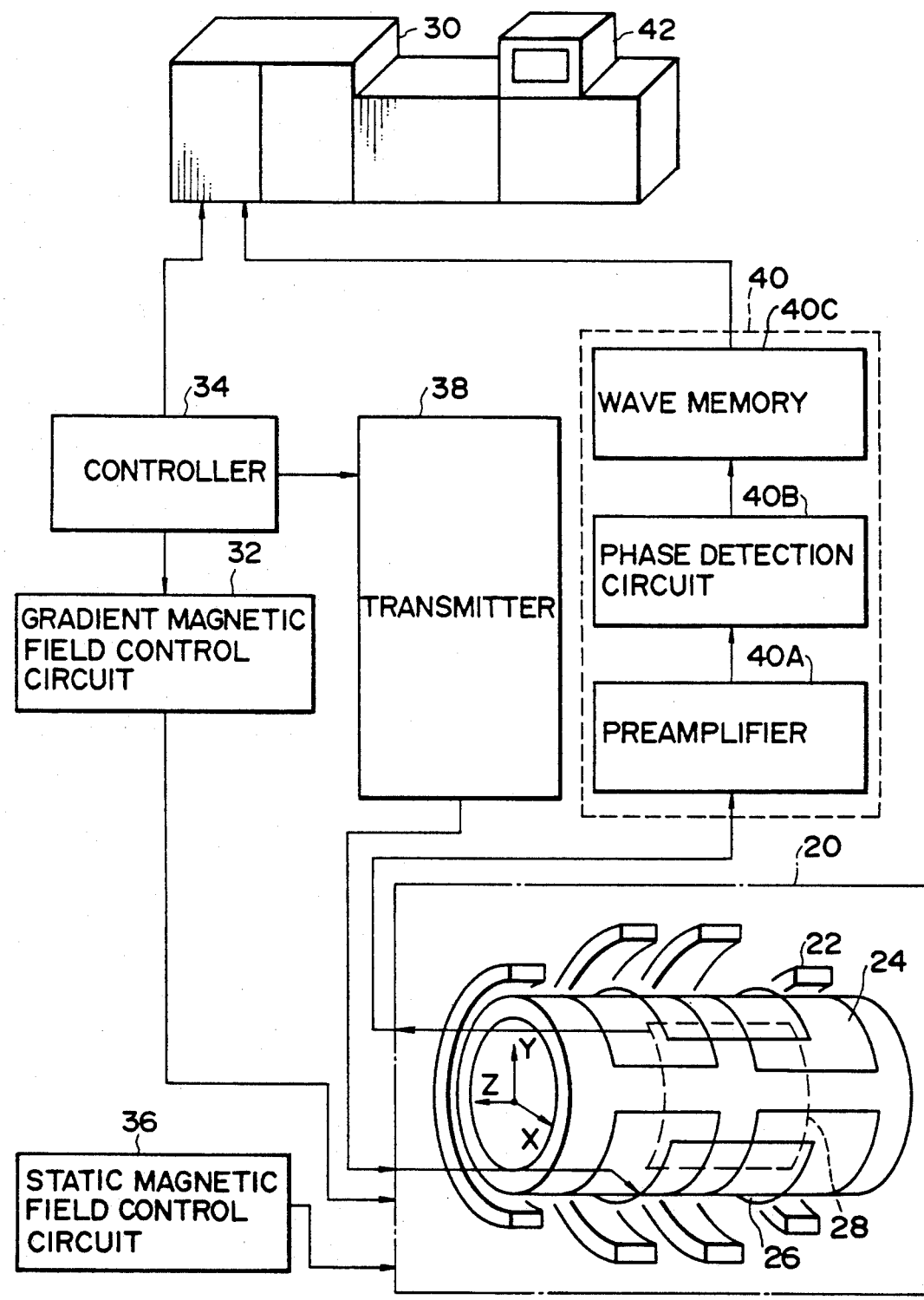
F I G. 2

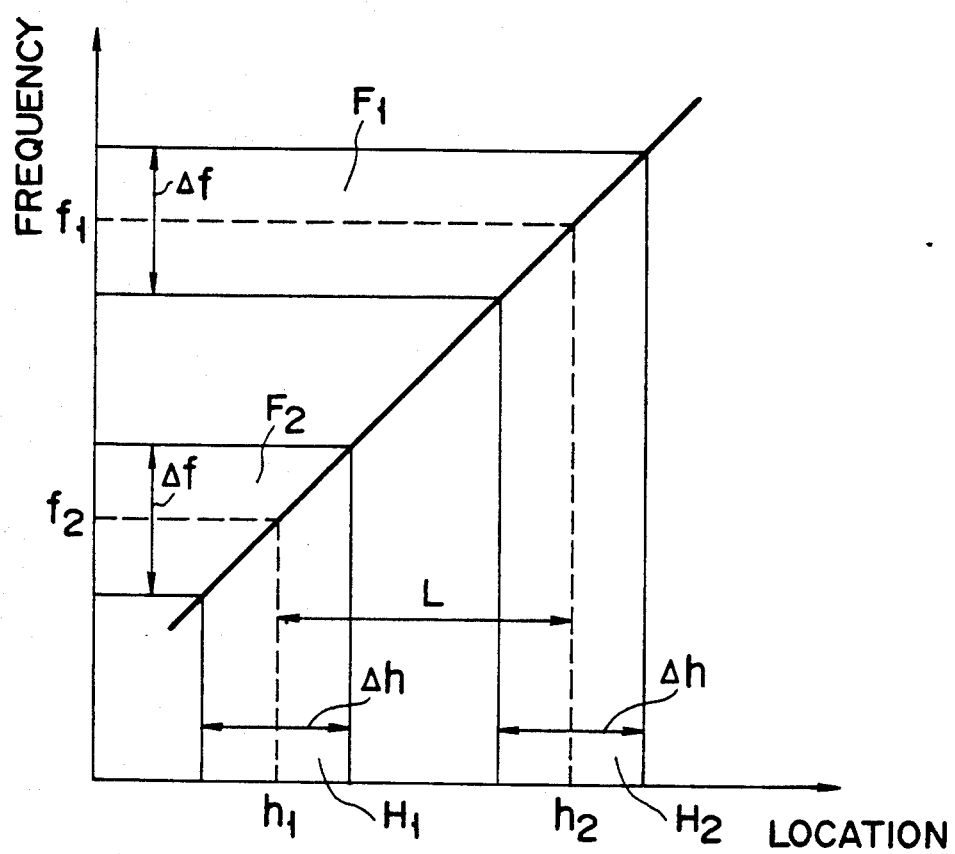
F I G. 4

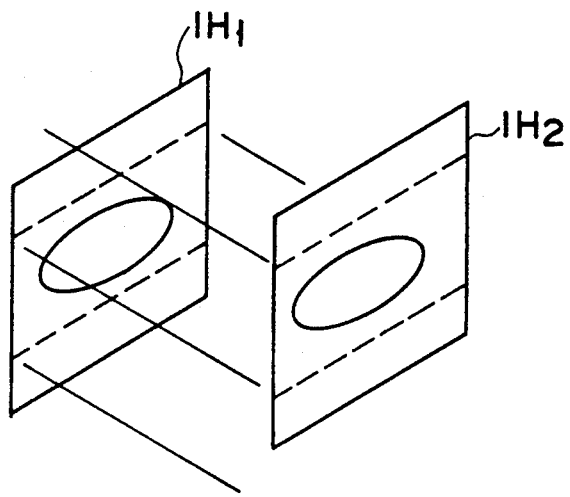
F I G. 7
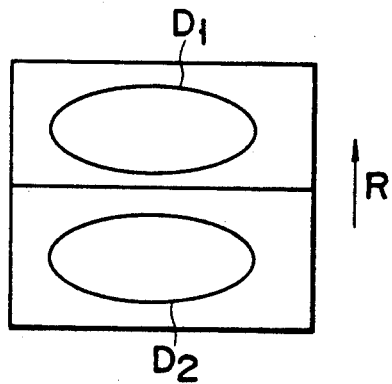
F I G. 8

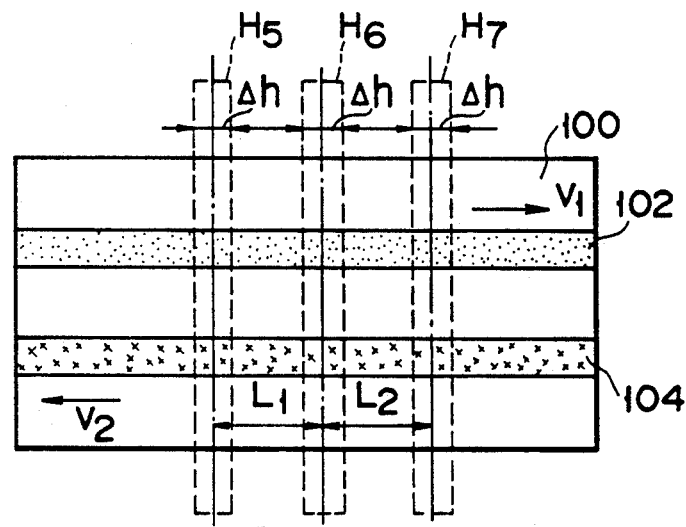
F I G. 11A
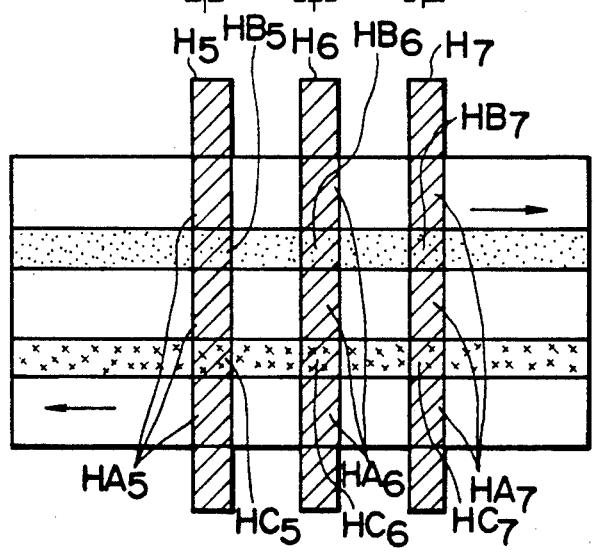
F I G. 11B
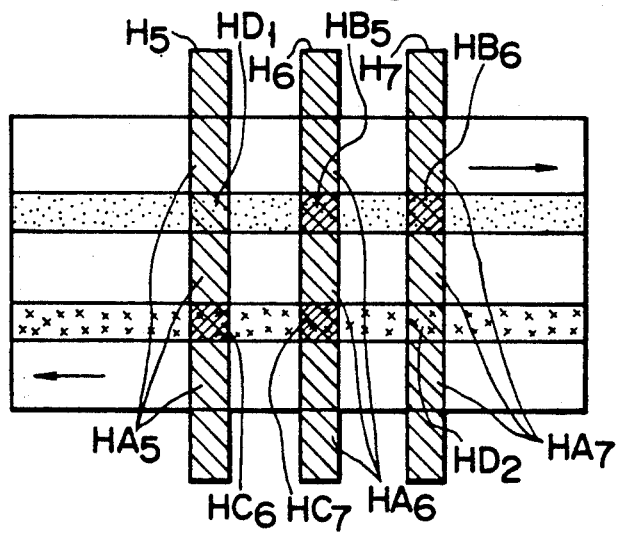
F I G. 11C

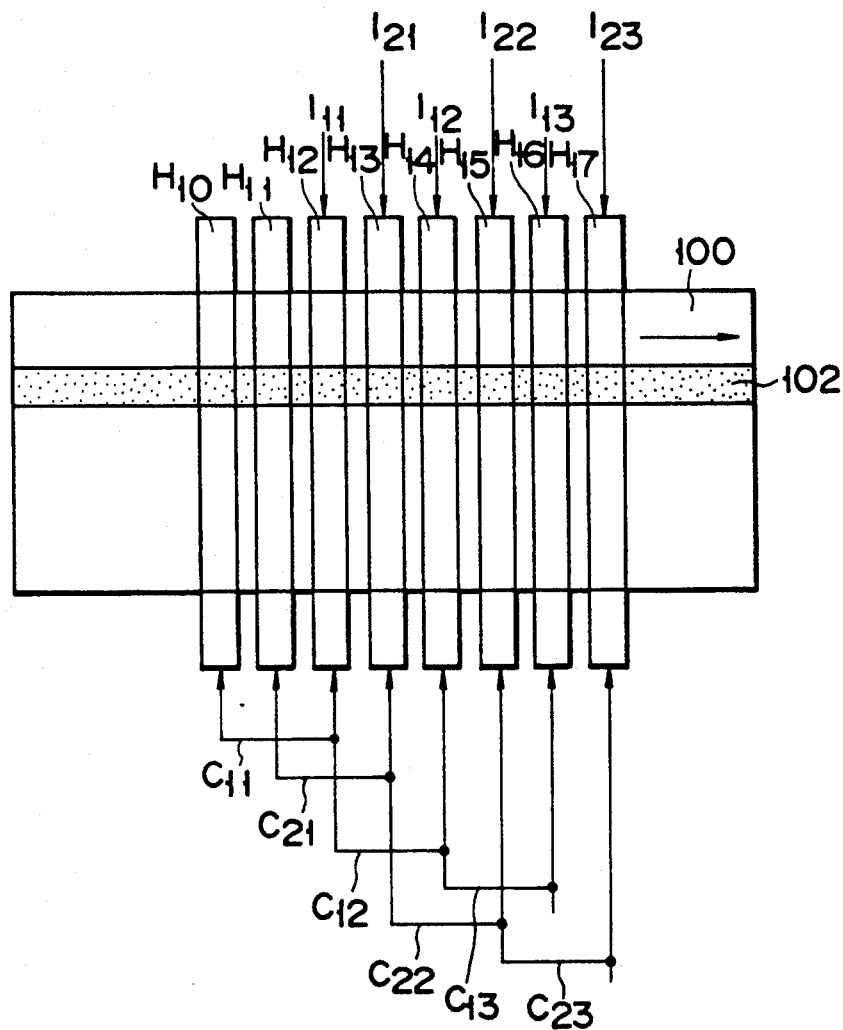
F I G. 14

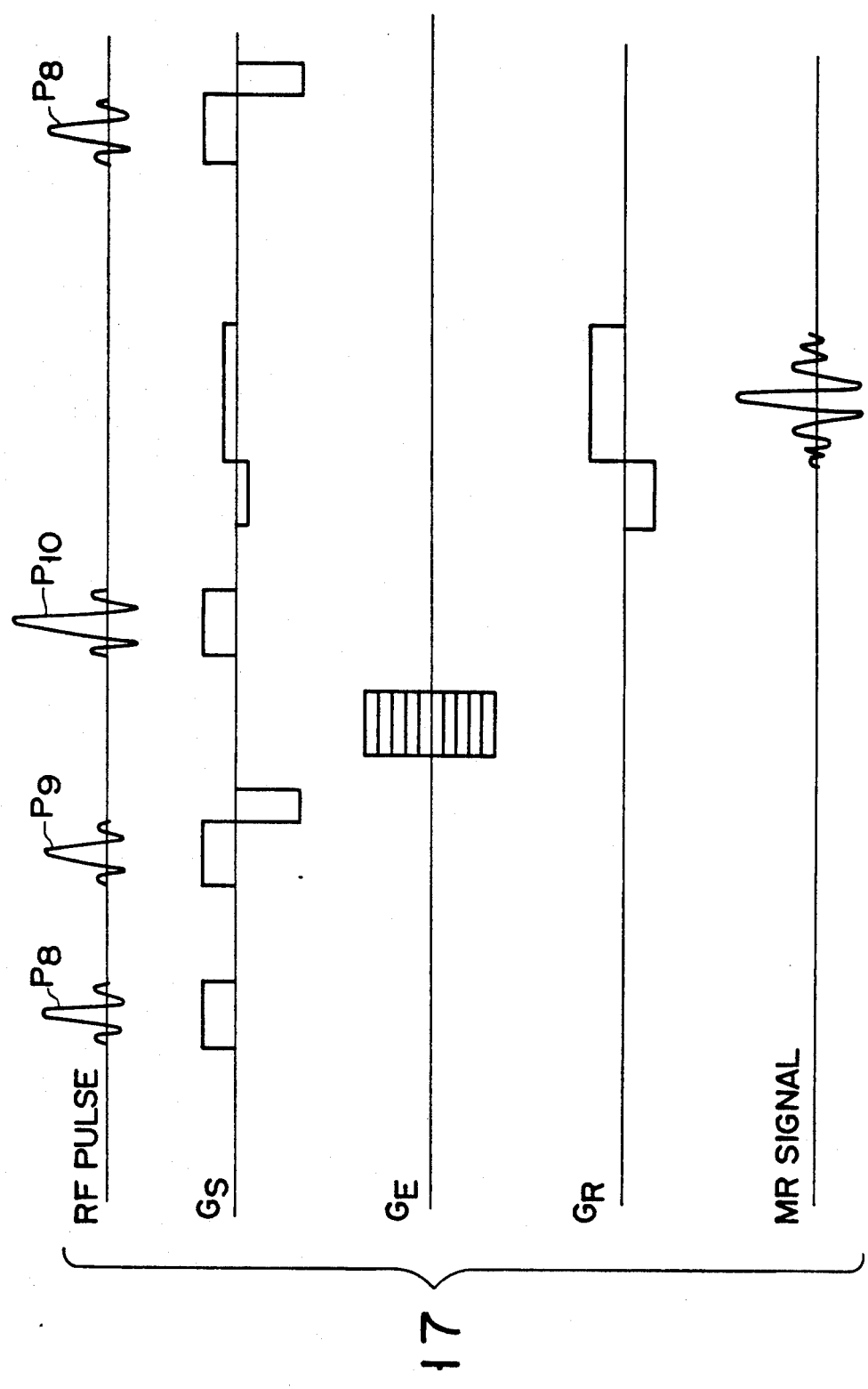
F I G. 17

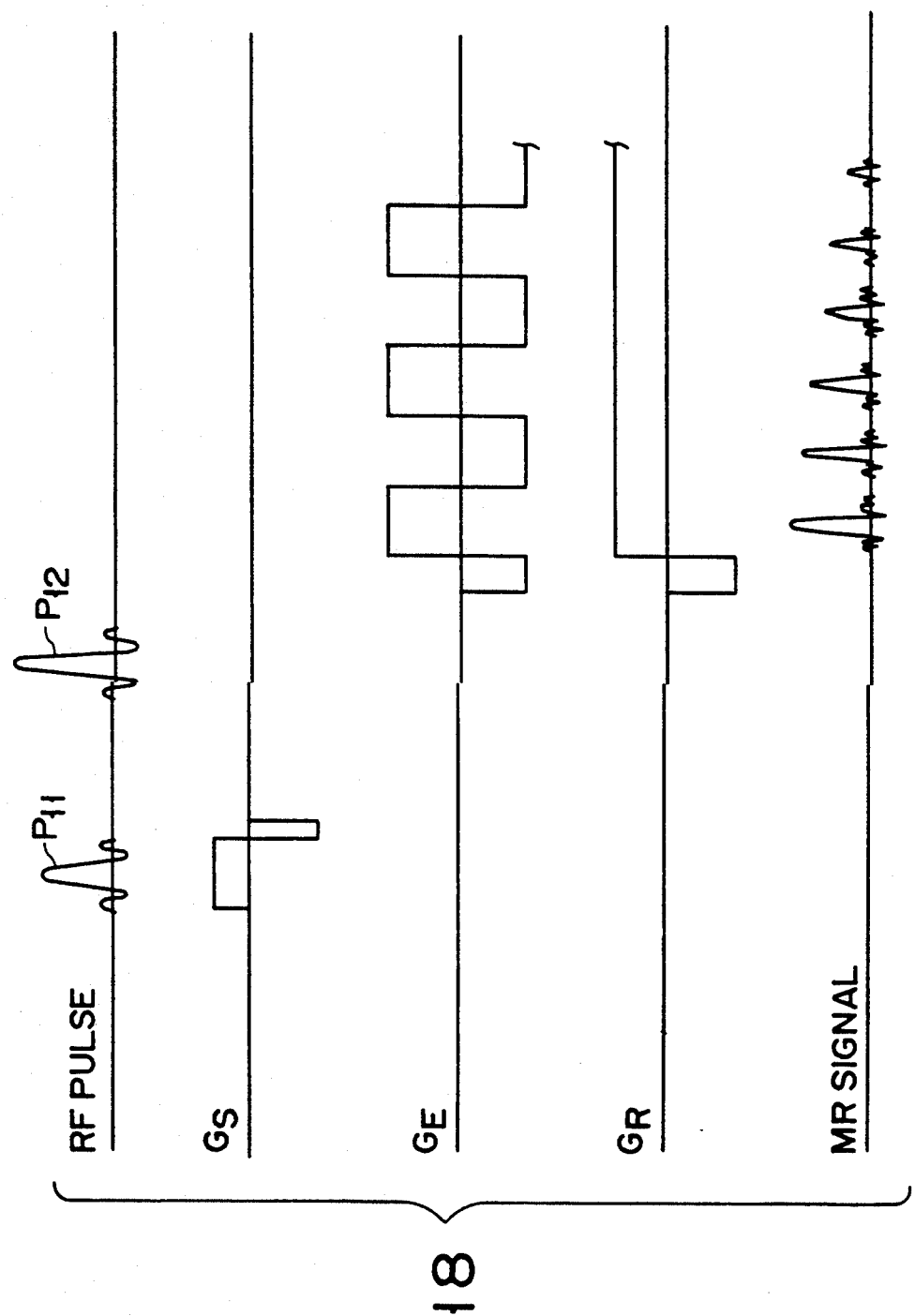
F I G. 18

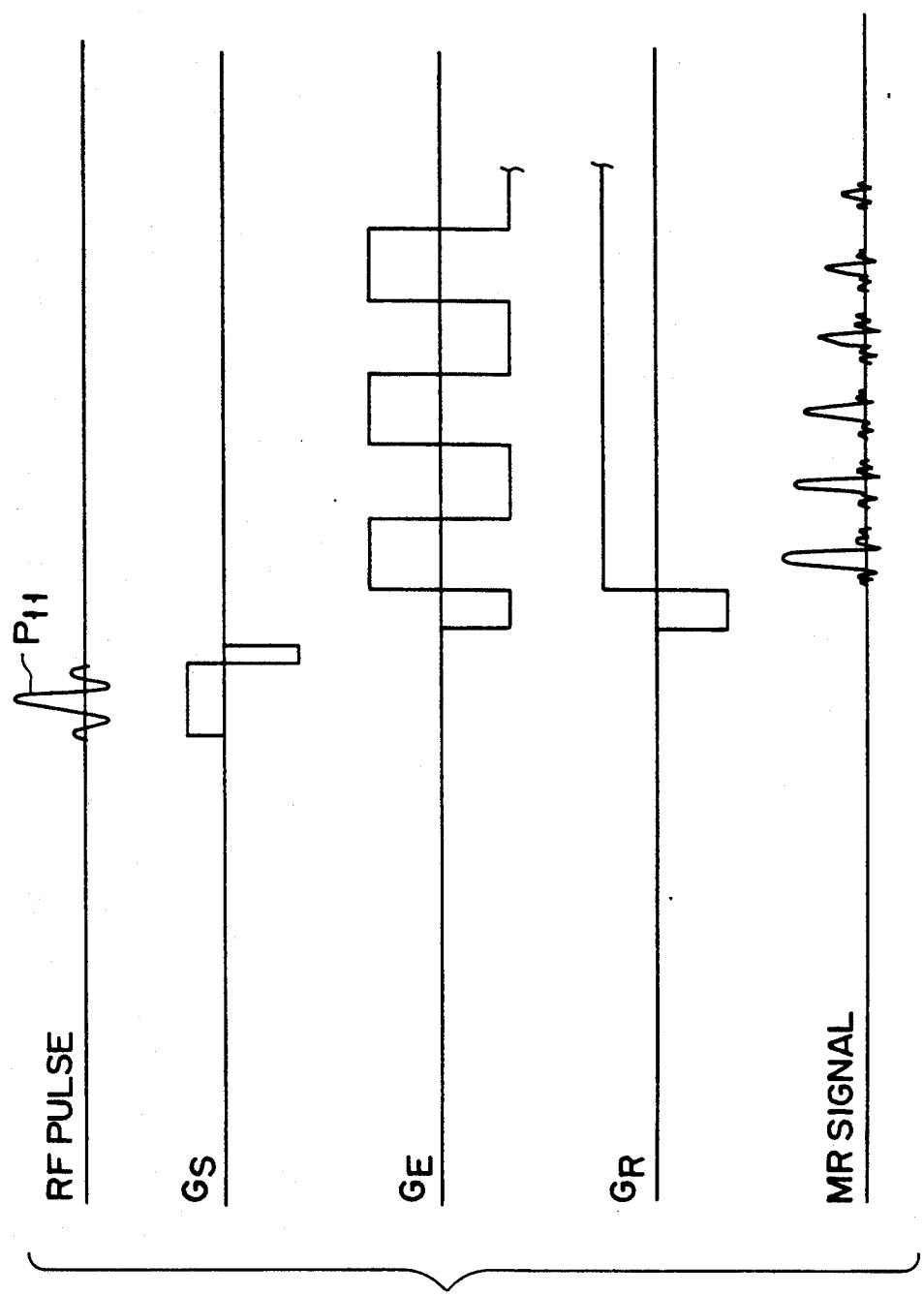
F I G. 19

MAGNETIC RESONANCE IMAGING METHOD AND APPARATUS FOR THE SAME

BACKGROUND OF THE INVENTION

1. Field of the Invention

The present invention relates to a magnetic resonance imaging method for obtaining a magnetic resonance signal (to be referred to as an MR signal hereinafter) of an object to be examined (usually a patient) and an apparatus for the same and, more particularly, to a method and apparatus for decreasing an image quality degradation, caused by an artifact generated in an magnetic resonance image (to be referred to as an MR image hereinafter) due to the presence of a fluid in the object to be examined, e.g., a blood flow and a cerebrospinal fluid (CSF).

2. Description of the Related Art

The assignee of the present invention has already filed in Japan a patent application of a magnetic resonance imaging technique for obtaining a good MR image, which is the precedent of the present invention. This patent application is known as Published Unexamined Japanese Patent Application No. 63-046146. The magnetic resonance imaging technique in this patent application discloses a local excitation method. According to this local excitation method, first, regions adjacent to a prospective data acquisition region are non-signaled so that no MR signal is generated there, and thereafter the data acquisition region is locally excited. In the local excitation method, a high-frequency pulse (to be referred to as an RF pulse hereinafter) having a flip angle of 90° and gradient magnetic fields GX, GY, and GZ as slicing magnetic fields are sequentially applied to an object to be examined placed in the static magnetic field, and the object is sliced in three directions. A three-dimensional local region is excited by slicing. Gradient magnetic fields GX, GY, and GZ having a high magnetic field intensity are applied immediately after excitation of the local region in order to disperse the lateral magnetization components outside the local region. The regions outside the local region are non-signaled by these steps. Then, a desired region (slice plane) in the local region is selectively excited, and an MR signal is acquired from the selectively excited slice plane.

In such a local excitation method, when a T1 intensity image of a component having a short longitudinal relaxation time T1 is to be obtained, magnetization restarts at the initial stage of the gradient magnetic field application. Then, a non-signaling degree outside the local region is partially impaired. As a result, it is difficult to obtain a good image. If a fluid such as a flowing blood and a cerebrospinal fluid is present in the data acquisition region (slice plane), a phase difference occurs to cause an artifact in the MR image.

A clinical inconvenience caused by such problems will be described with reference to FIG. 1. An abdominal tomographic image of an object to be examined is displayed on a monitor screen 10. A liver 12, a heart 14, and a lung 16 appear on this tomographic image. Blood vessels such as an artery and a vein exist in these organs. A belt-like artifact 18 may be generated in the central portion of the screen 10 due to the blood flowing in such vessels. The belt-like artifact 18 may overlap an end portion 12A of the liver 12. As a result, an observer (doctor) may erroneously recognize the end portion 12A of the liver 12 as an abnormal portion even if it is not actually abnormal. Also, if an artifact 18 appears to overlap the end portion 12A of the liver 12 despite that no artifact is generated actually, the doctor may erroneously recognize that the end portion 12A of the liver 12 as a normal portion. This makes it difficult to discover a liver disease such as a liver cancer and a hepatocirrhosis at an early stage.

SUMMARY OF THE INVENTION

It is, therefore, an object of the present invention to provide a magnetic resonance imaging system for obtaining a good MR image of a selected region by decreasing an artifact even if a fluid is present, and an apparatus for the same.

It is another object of the present invention to provide a magnetic resonance imaging method capable of displaying an image to facilitate discovery of a liver disease at an early stage, and an apparatus for the same.

These objects can be achieved by a magnetic resonance imaging method comprising:

the first step of causing magnetic resonance excitation of first and second regions of an object to be examined simultaneously, the second region being separated from the first region by a predetermined distance and not intersecting with the first region;

the second step of acquiring a magnetic resonance signal from only the second region, the second step being executed after the first step; and the third step of performing image reconstruction processing of the magnetic resonance signal acquired in the second step in order to obtain a tomographic image of the second region.

These objects can be achieved also by a magnetic resonance imaging method comprising:

the first step of causing magnetic resonance excitation of first and second regions of an object to be examined simultaneously, the second region intersecting with the first region;

the second step of acquiring a magnetic resonance signal from only the second region, the second step being executed after the first step; and the third step of performing image reconstruction processing of the magnetic resonance signal acquired in the second step in order to obtain a tomographic image of the second region.

These objects can also be achieved by a magnetic resonance imaging method comprising:

the first step of causing magnetic resonance excitation of at least first and third regions of the first and third regions and a second region of an object to be examined simultaneously, the second region being separated from the first region by a predetermined distance and not intersecting with the first region, the third region being separated from the second region and intersecting with neither the first nor second regions;

the second step of acquiring a magnetic resonance from only the second region, the second step being executed after the first step; and the third step of performing image reconstructing processing of the magnetic resonance signal acquired in the second step in order to obtain a tomographic image of the second region.

These steps can also be achieved by a magnetic resonance imaging apparatus comprising:

static magnetic field generating means for generating a static magnetic field to be applied to an object to be examined;

transmitting means for transmitting an exciting radio frequency pulse magnetic field in order to cause magnetic resonance excitation in a plurality of regions of the object simultaneously;

receiving means for receiving a magnetic resonance signal induced from the object;

image reconstruction processing means for performing image reconstruction processing of the magnetic resonance signal received by the receiving means; and control means for controlling at least the gradient magnetic field generating means and the transmitting means in accordance with a predetermined imaging scheme.

Additional objects and advantages of the invention will be set forth in the description which follows, and in part will be obvious from the description, or may be learned by practice of the invention. The objects and advantages of the invention may be realized and obtained particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a block diagram of the first embodiment of a magnetic resonance imaging apparatus according to the present invention;

FIG. 4 shows the relationship between an RF pulse and an excitation region;

FIGS. 7 and 8 are schematic views showing a positional relationship between two excitation regions (slice planes) generated by the execution of the pulse sequence shown in FIG. 5;

FIGS. 11A to 11C are schematic views showing a change over time in the excitation region accompanying the execution of the magnetic resonance imaging method of the present invention;

FIG. 14 is a schematic view showing the fourth embodiment of a magnetic resonance imaging method according to the present invention by way of the relationship between the data acquisition region and the non signaled regions;

FIG. 17 is a timing waveform chart showing an inversion recovery scheme which is still another example of the basic pulse sequence with which any one of the first to fifth embodiments of the magnetic resonance imaging methods according to the present invention can be practiced;

FIGS. 18 and 19 are timing waveform charts showing an echo planar scheme which is another example of the basic pulse sequence with which any one of the first to fifth embodiments of the magnetic resonance imaging methods according to the present invention can be practiced.

DETAILED DESCRIPTION OF THE PREFERRED EMBODIMENTS

Figure 1:
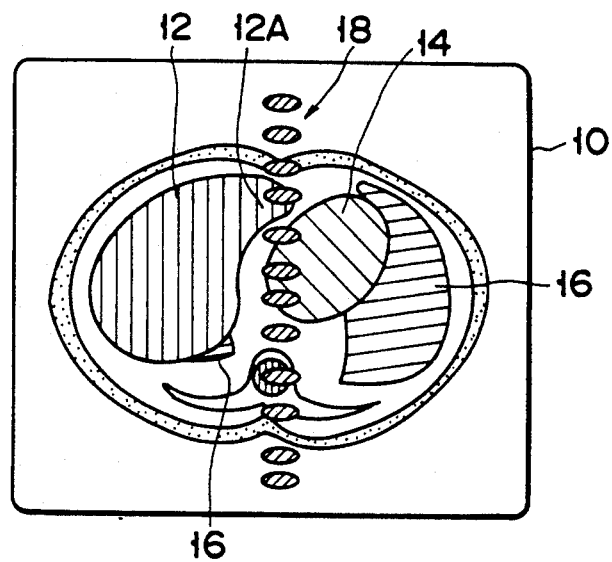
FIG. 1 is a view showing a problem of a blood flow artifact.

The preferred embodiments of the present invention will be described in detail.

As shown in FIG. 2, the magnetic resonance imaging apparatus of the first embodiment has a magnet assembly 20. The magnet assembly 20 has a static magnetic field coil 22, a gradient magnetic field coil 24, an excitation coil 26, and a detection coil 28. The static magnetic field coil 22 applies a static magnetic field H0 having a predetermined intensity to an object to be examined (not shown) inserted in the magnet assembly 20. The gradient magnetic field coil 24 applies gradient fields in x-, y-, and z-directions to the object to be examined. The excitation coil 26 excites spinning of atomic nuclei and inclines the magnetization by a predetermined angle. The detection coil 28 detects an MR signal induced by the interior of the object to be examined.

The detection coil 28 has a z-direction static magnetic field for detecting a lateral magnetization component of atomic nucleus magnetization in an x-y plane.

A data processor 30 controls application of a gradient magnetic field GS, an encoding gradient magnetic field GE, and a read gradient magnetic field GR and controls a sequence with which an RF pulse is generated.

A gradient magnetic field control circuit 32 controls the current flowing across the gradient magnetic field coil 24 under the control of the controller 34 and applies the gradient magnetic fields GS, GE, and GR to the object to be examined.

A static magnetic field control circuit 36 controls the current supplied to the static magnetic field coil 22 and applies the static magnetic field H0 to the object to be examined.

A transmitter 38 supplies an RF pulse to the excitation coil 26.

A receiver 40 comprises a preamplifier 40A, a phase detection circuit 40B, and a wave memory 40C. The preamplifier 40A amplifies an MR signal sent from the detection coil 28. The phase detection circuit 40B detects the phase of the amplified MR signal. The wave memory 40C stores the phase-detected wave signal.

The data processor 30 controls the controller 34, receives time data from the controller 34, and reads out data from the wave memory 40C to reconstruct the observed MR signal. The data processor 30 can also display a prompt to the operator.

Figure 3:
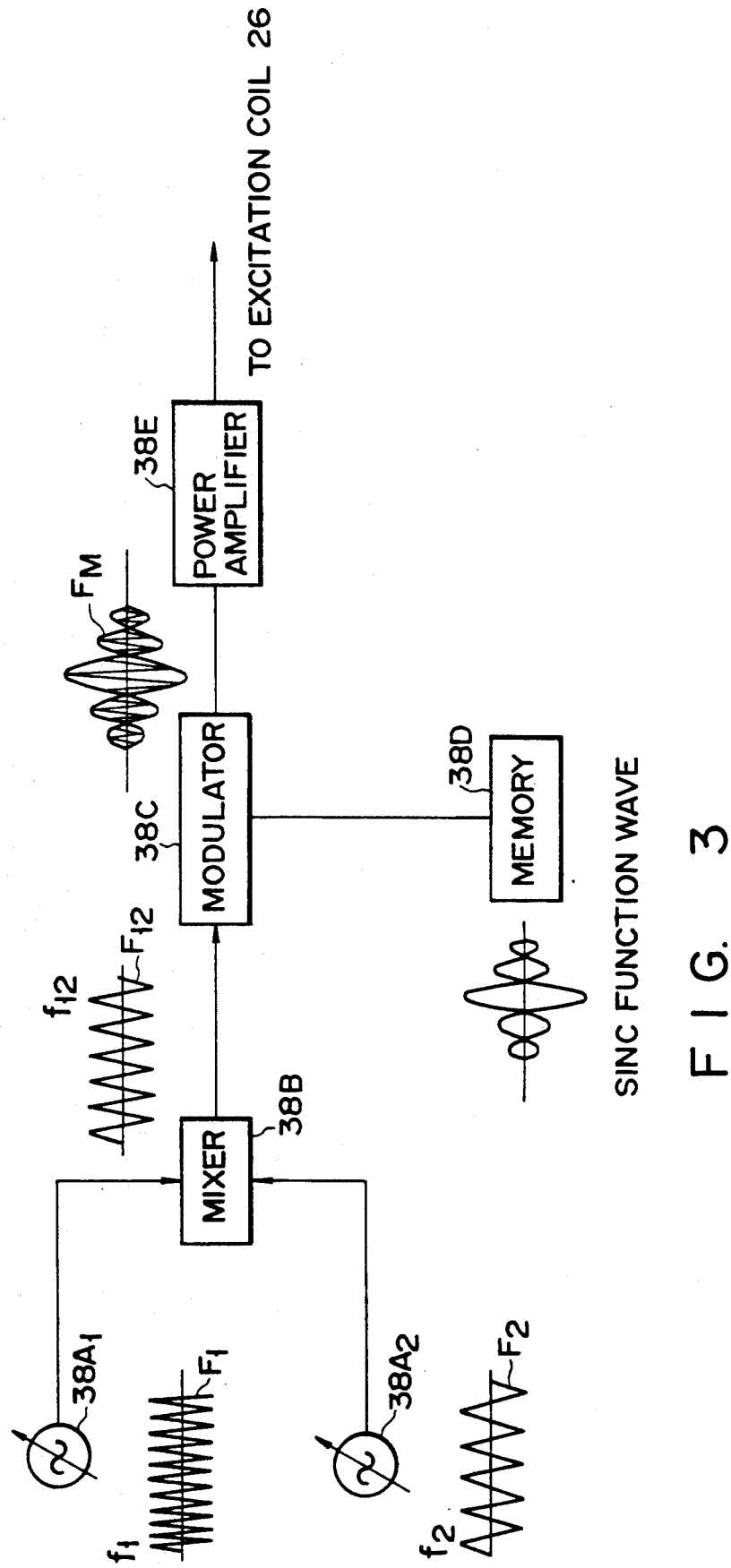
FIG. 3 is a block diagram showing in detail an arrangement of a receiver of the apparatus of FIG. 2.

The transmitter 38 as the major characteristic feature of this apparatus will be described in detail with reference to FIGS. 3 and 4. More specifically, the transmitter 38 controlled by the controller 34 comprises a first variable frequency oscillator 38A1, a second variable frequency oscillator 38A2, a mixer 38B, a modulator 38C, a memory 38D, and a power amplifier 38E. The first variable frequency oscillator 38A1 generates a first carrier F1 having a center frequency f1 and a frequency band $\Delta f$. The second variable frequency oscillator 38A2 generates a second carrier F2 having a center frequency f2 and a frequency band $\Delta f$. The mixer 38B mixes the first and second carriers F1 and F2 to generate a mixed carrier F12. Note that $f1 < f12 < f2$. The mixed carrier F12 is supplied to the modulator 38C. The modulator 38C also receives a SINC function wave stored in the memory 38D. The memory 38D stores a plurality of SINC function waves corresponding to flip angles of 90°, 180°, and $\alpha°$ ($\alpha$ is an arbitrary angle). Thus, the modulator 38C modulates the amplitude of the mixed carrier F12 with one SINC function wave supplied from the memory 38D to generate a modulated wave FM. The modulated wave FM is power-amplified by the power amplifier 38E and supplied to the excitation coil 26.

When this transmitter 38 is used, two regions can be simultaneously excited, which will be described with reference to FIG. 4. More specifically, the first carrier F1 excites a region F1 having a central position h1 and a width (thickness) $\Delta h$. The second carrier F2 excites a region F2 having a central position h2 and a width (thickness) $\Delta h$. Since the modulated wave FM includes the first and second carriers F1 and F2, it can excite regions H1 and H2 separated by a distance L1 at once. The distance L1 is determined by a difference f1-f2 in center frequency between the two carriers.

The pulse sequence of the first embodiment of the magnetic resonance imaging method according to the present invention will be described with reference to FIG. 5. This pulse sequence is based on the spin echo scheme. One encoding cycle of this pulse sequence consists of periods ST1, ST2, ST3, and ST4. When this encoding cycle is performed a plurality of times while changing the intensity of the encoding gradient magnetic field GE, an MR signal group for reconstructing one frame can be obtained. When the MR signal group is subjected to reconstruction processing such as Fourier transform, a single tomographic image can be obtained.

Figure 5:
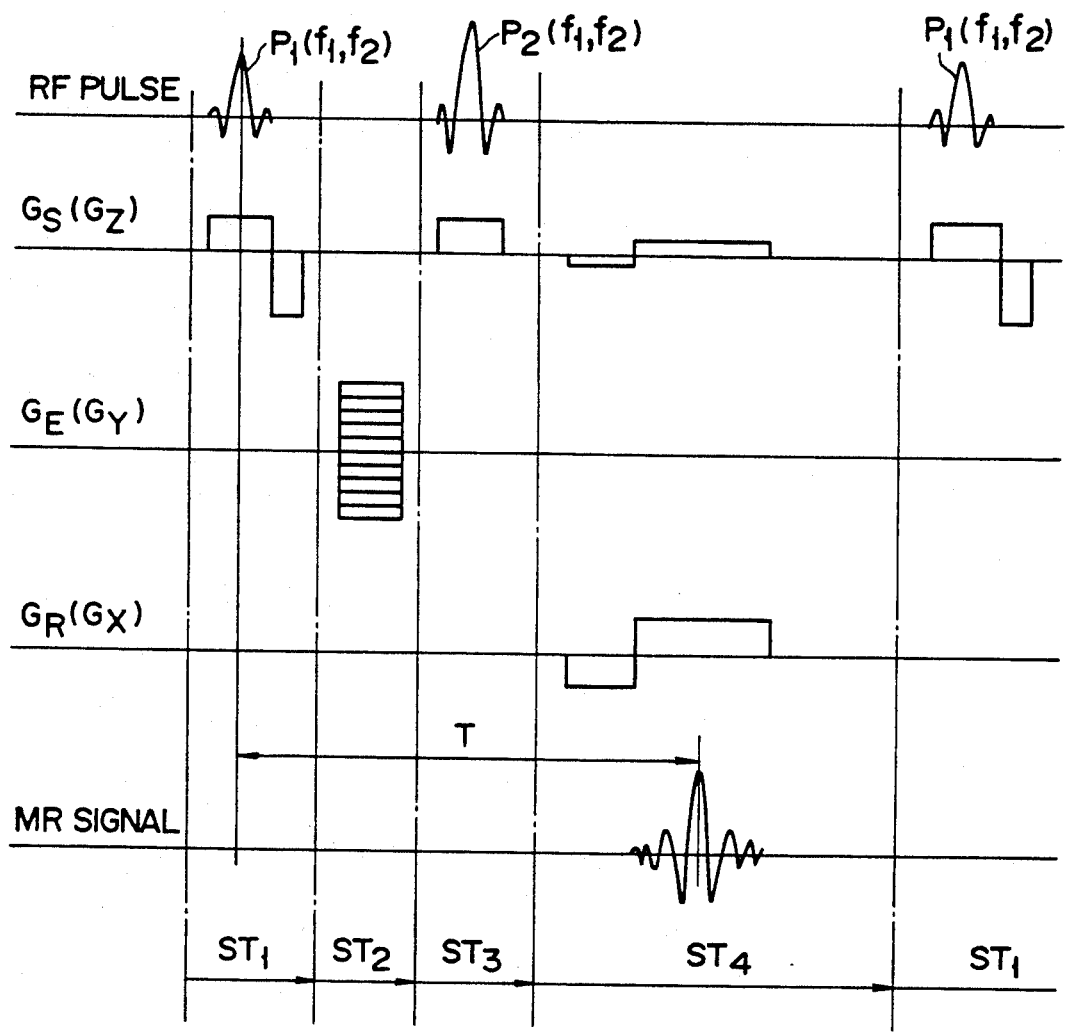
FIG. 5 is a timing waveform chart of the first embodiment of a magnetic resonance imaging method according to the present invention which is practiced by the apparatus shown in FIG. 2 and showing a pulse sequence utilizing a spin echo scheme as the basic pulse sequence.
Figure 6A:
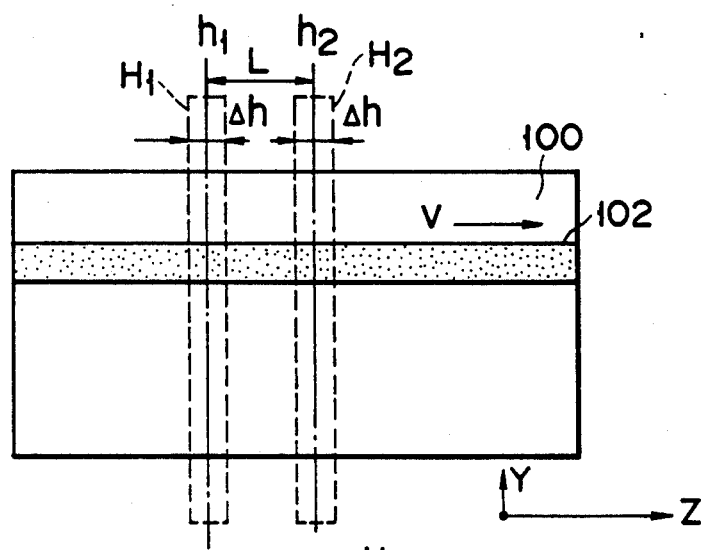
FIGS. 6A to 6C are schematic views showing a change over time in the excitation region accompanying the execution of the pulse sequence shown in FIG. 5.
Figure 6B:
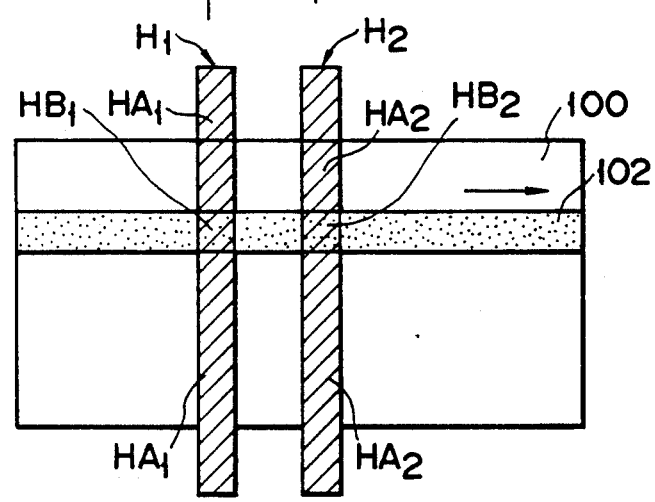
Figure 6C:
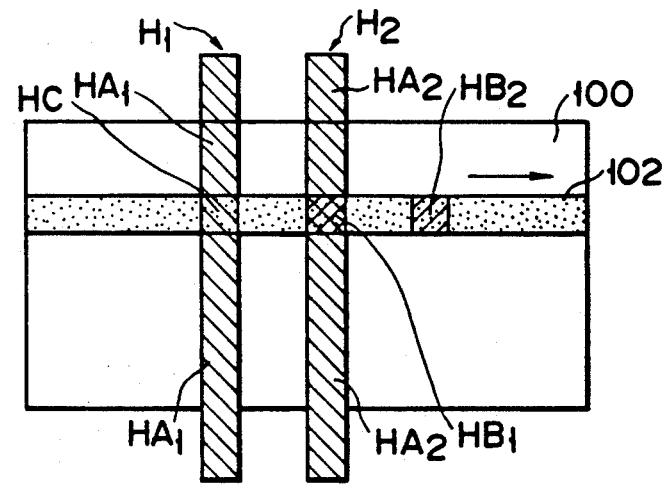

Referring to FIG. 5, a state preceding the period ST1 is shown in FIG. 6A. FIG. 6A shows an imaging target portion of the first embodiment of the method. More specifically, as shown in FIG. 6A, the imaging target is a portion in an object 100 to be examined where a blood vessel 102, either an artery or vein, exists. The state of the period ST1 is shown in FIG. 6B. The state of the period ST4 is shown in FIG. 6C. Although not shown in FIGS. 6A to 6C, the states of periods ST2, ST3, and ST4 are substantially understandable from FIG. 6B.

As shown in FIG. 5, in the period ST1, a mixed RF pulse P1 having a flip angle of 90° and a slicing gradient field GS are applied to the object 100. The object 100 is placed inside the magnet assembly 20 of FIG. 2 and set in the static magnetic field. When the RF pulse P1 is applied to the object 100, the separated slice regions H1 and H2 having thicknesses $\Delta h$ are excited, as shown in FIG. 6B. The regions H1 and H2 intersect with the blood vessel 102 in which blood flows. The region H1 consists of a non-intersecting region HA1 and an intersecting region HB1. The region H2 consists of a non-intersecting region HA2 and an intersecting region HB2. In FIGS. 6A to 6C, the slicing gradient magnetic field GS is a Z-axis gradient magnetic field GZ so that the sections of the object 100 perpendicular to the body axis become the regions H1 and H2. During the period ST2, an encoding gradient magnetic field GE is applied to the object 100. The encoding gradient magnetic field GE is a Y-axis gradient magnetic field GY in FIGS. 6A to 6C. During the period ST3, a mixed RF pulse P2 having a flip angle 180° and a slicing gradient magnetic field GS are applied to the object 100. During the period ST4, a read gradient magnetic field GR for acquiring an MR signal and a slicing gradient magnetic field GS having a low magnetic field intensity for separating the MR signal into the regions H1 and H2 are applied to the object 100. As a result, MR signals are induced from the regions H1 and H2. However, the detection coil 24 acquires the MR signal only from the region H2. In this case, during the period ST4, the region H1 consists of the initial non-intersecting region HA1 and a newly added intersecting region HC, as shown in FIG. 6C. The region H2 consists of the initial non-intersecting region HA2 and a new intersecting region HB1 added from the region H1. The initial intersecting region $HB_2$ of the region H2 is shifted downstream. These phenomena are caused because the blood flows in the blood vessel 102 at a rate v. Thus, a distance L between the regions H1 and H2 is substantially specified by $v \times T$ where T is the time started with application of the initial RF pulse P1 and terminated with acquisition of the MR signal. Note that the read gradient magnetic field GR is an X-axis gradient magnetic field in FIGS. 6A to 6C.

From the foregoing, in the region H2, an MR signal is induced in the initial non-intersecting region HA2 whereas it is not in the intersecting region HB1 added from the region H1. As a result, the magnetization axis of the blood flow in the intersecting region HB1 is excited by one pulse ago, and becomes the saturated state. And thus the lateral magnetization component of the blood flow of the intersecting region HB1 is substantially decreased. Then, the detection coil 24 acquires MR signals from only the non-intersecting region HA2. In other words, the intersecting region HB1 is non-signaled.

When an MR signal is to be read, a weak slicing gradient magnetic field GS is applied in addition to the read gradient magnetic field GR, as shown in FIG. 5, in order to discriminate the MR signals from the regions H1 and H2, as shown in FIG. 7. In fine, data D1 acquired from the region H1 and data D2 acquired from the region H2 are separately acquired in the direction of the read direction R, as shown in FIG. 8.

As described above, according to this embodiment, an MR image of a region H2 free from the influence of the blood flow can be obtained. In addition, the application timings of the 90° and 180° pulses are the same as those of the spin echo scheme. The only difference between this method and the spin echo scheme is that, in this embodiment, each of the 90° and 180° pulses includes two carriers. The time required for data acquisition is the same as that of the spin echo scheme. This contributes to shortening of the scanning time.

Figure 9:
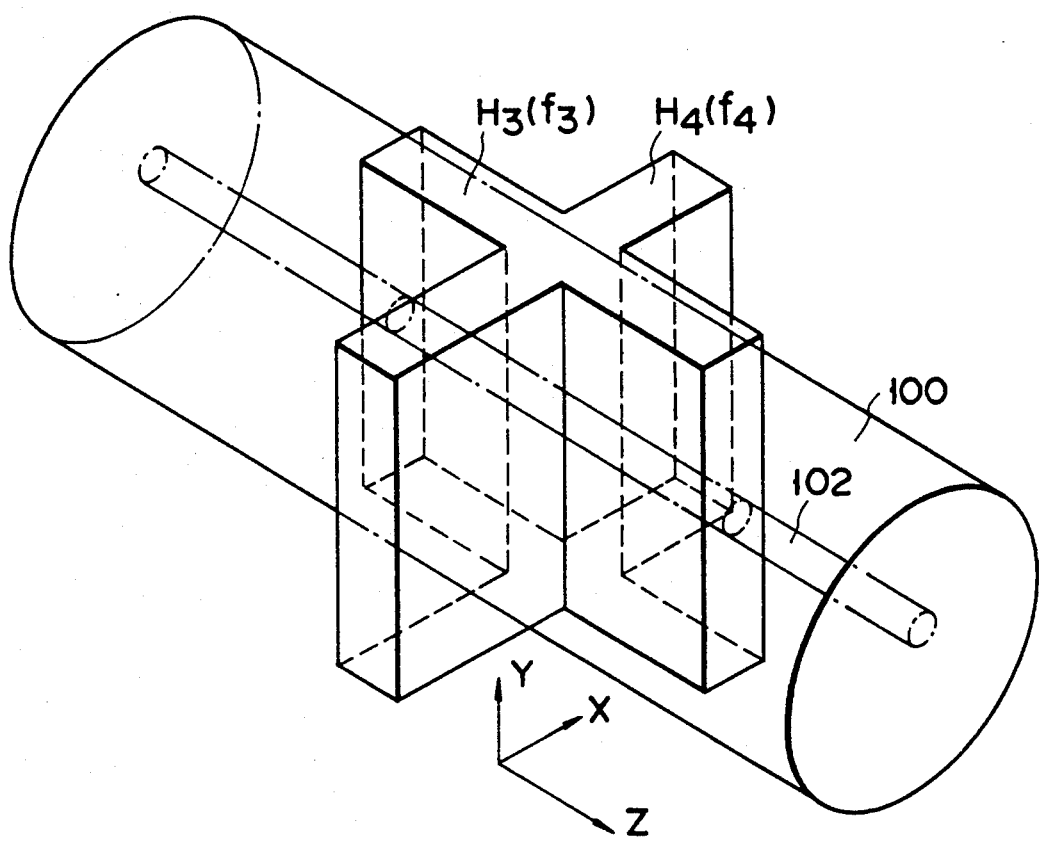
FIG. 9 schematically shows a region excited by the second embodiment of a magnetic resonance imaging method according to the present invention.
Figure 10:
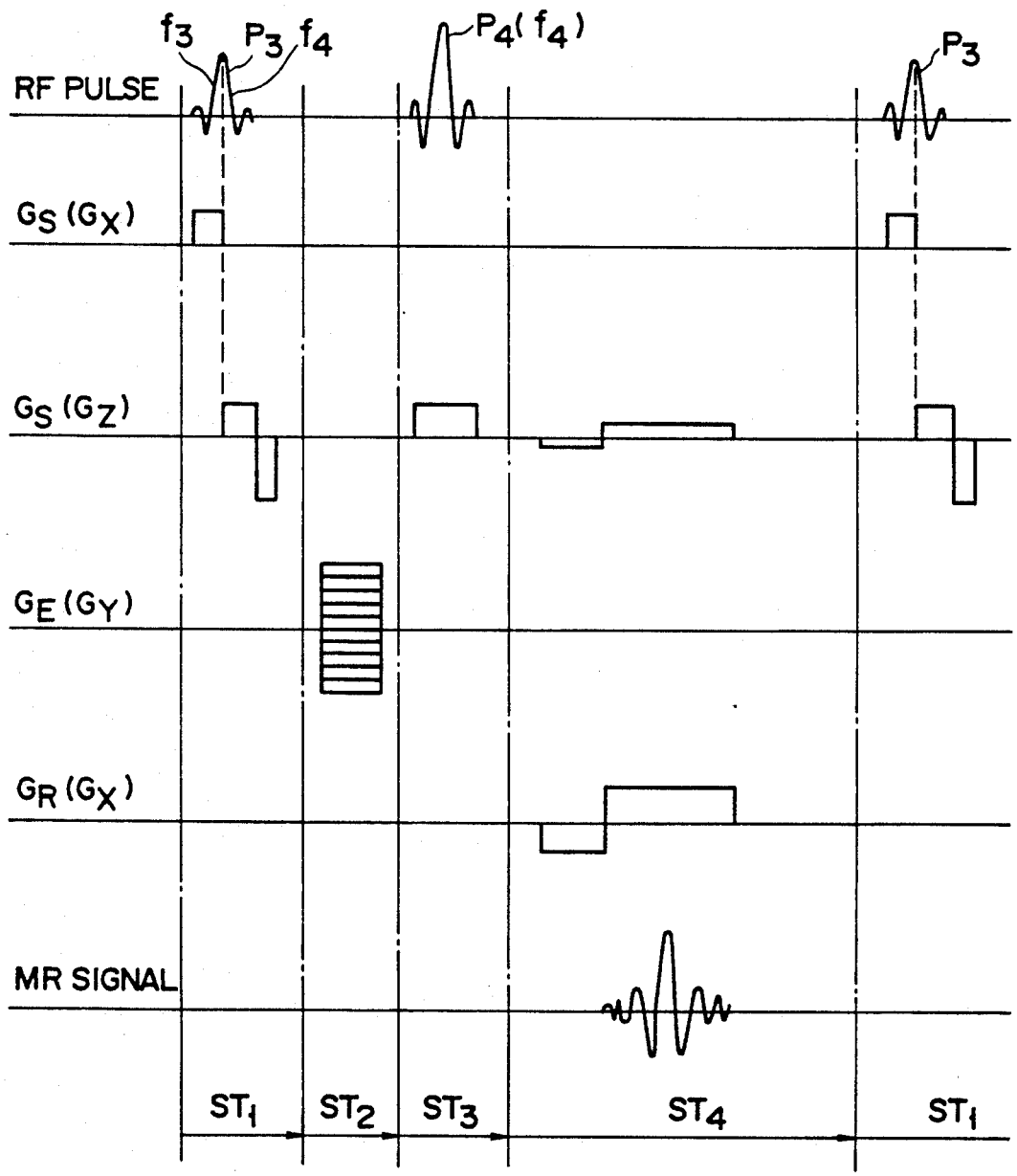
FIG. 10 is a timing waveform chart showing the pulse sequence of the second embodiment of the magnetic resonance imaging method according to the present invention.

The second embodiment of a magnetic resonance imaging method according to the present invention will be described. In the second embodiment, a slice region H3 perpendicular to the body axis of an object 100 to be examined is the data acquisition region, as shown in FIG. 9, and a region H4 where a blood vessel 102 is present is non-signaled. As shown in FIG. 10, a 90° pulse P3 is not a mixture of two carriers, unlike in the first embodiment. Rather, a carrier (having a center frequency f3) for exciting the non-signaled target area H3 is carried on the first half of the pulse P3, and a carrier (having a center frequency f4) for exciting the data acquisition target area H4 is carried on the second half of the pulse P3. During a period ST1, if the first half of the 90° pulse P3 for exciting the non-signaled target region H3 is ON, a slicing gradient magnetic field is applied to the object 100 with an X-axis gradient magnetic field. If the second half of the 90° pulse P3 for exciting the data acquisition target region H4 is ON, a slicing gradient magnetic field is applied to the object 100 with a Z-axis gradient magnetic field. A 180° pulse P4 carries a carrier (having a center frequency f4) for exciting the data acquisition region H4.

According to the second embodiment of the present invention, an image reconstructed by MR signals induced only from a portion of the data acquisition region H3 excluding the region H4 in which the blood vessel 102 is present can be obtained. With this method, an artifact caused by, e.g., a swallow of saliva can be decreased in obtaining a sagittal image of cervical vertebrae.

The third embodiment of a magnetic resonance imaging method according to the present invention will be described with reference to FIGS. 11A, 11B, 11C, 12, and 13. Each of the first and second embodiments provides an imaging method of a case in which the fluid present in the object to be examined flows in one direction. In contrast to this, the third embodiment provides an imaging method of a case in which fluids present in the object to be examined comprise two fluids flowing in opposite directions. More specifically, the third embodiment provides an imaging method of a case in which an artery and a vein intersect with the data acquisition region. The number of arteries and veins need not be specified in this embodiment. Likewise, the number of arteries and veins in the first and second embodiments need not be specified.

Figure 12:
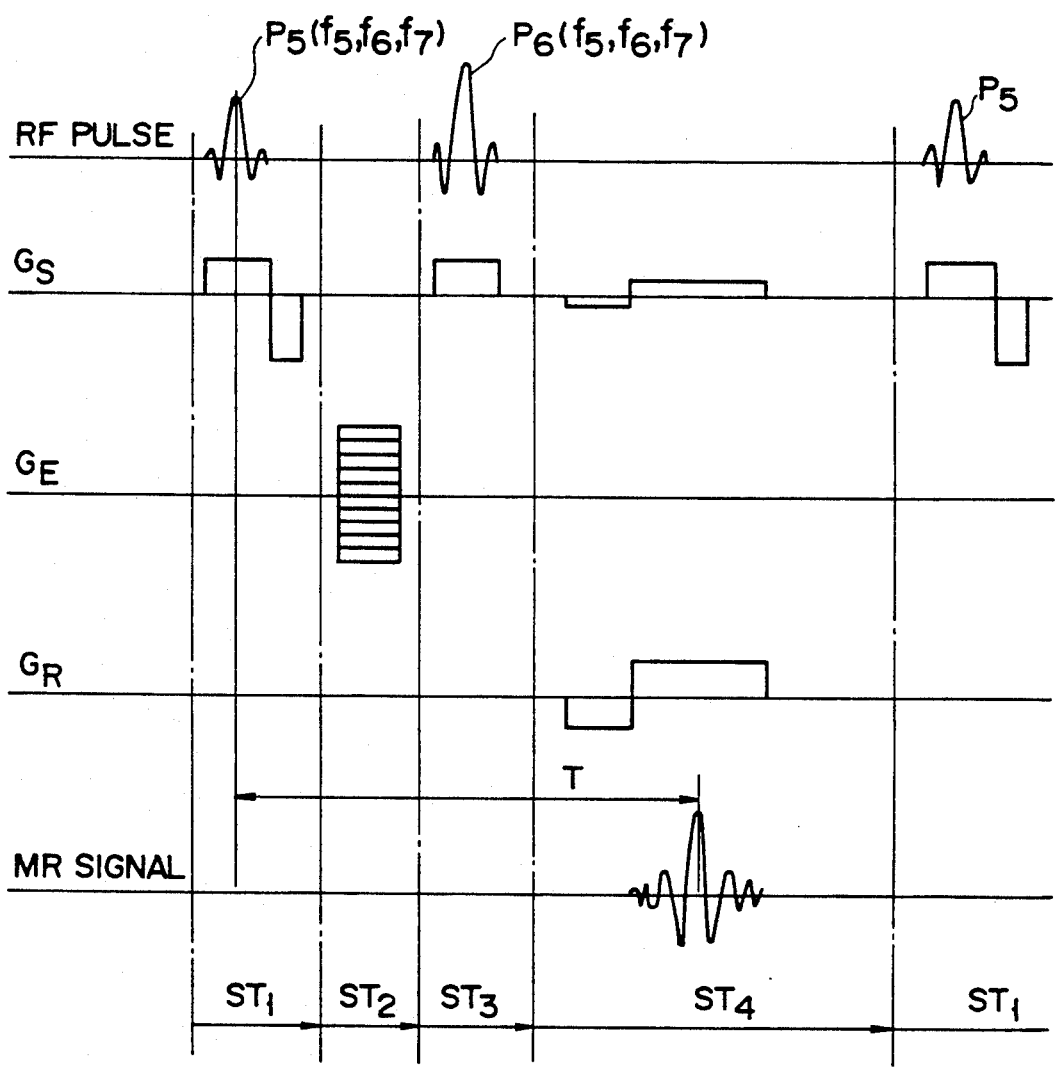
FIG. 12 is a timing waveform chart showing the pulse sequence for practicing the third embodiment of a method of the present invention.
Figure 13:
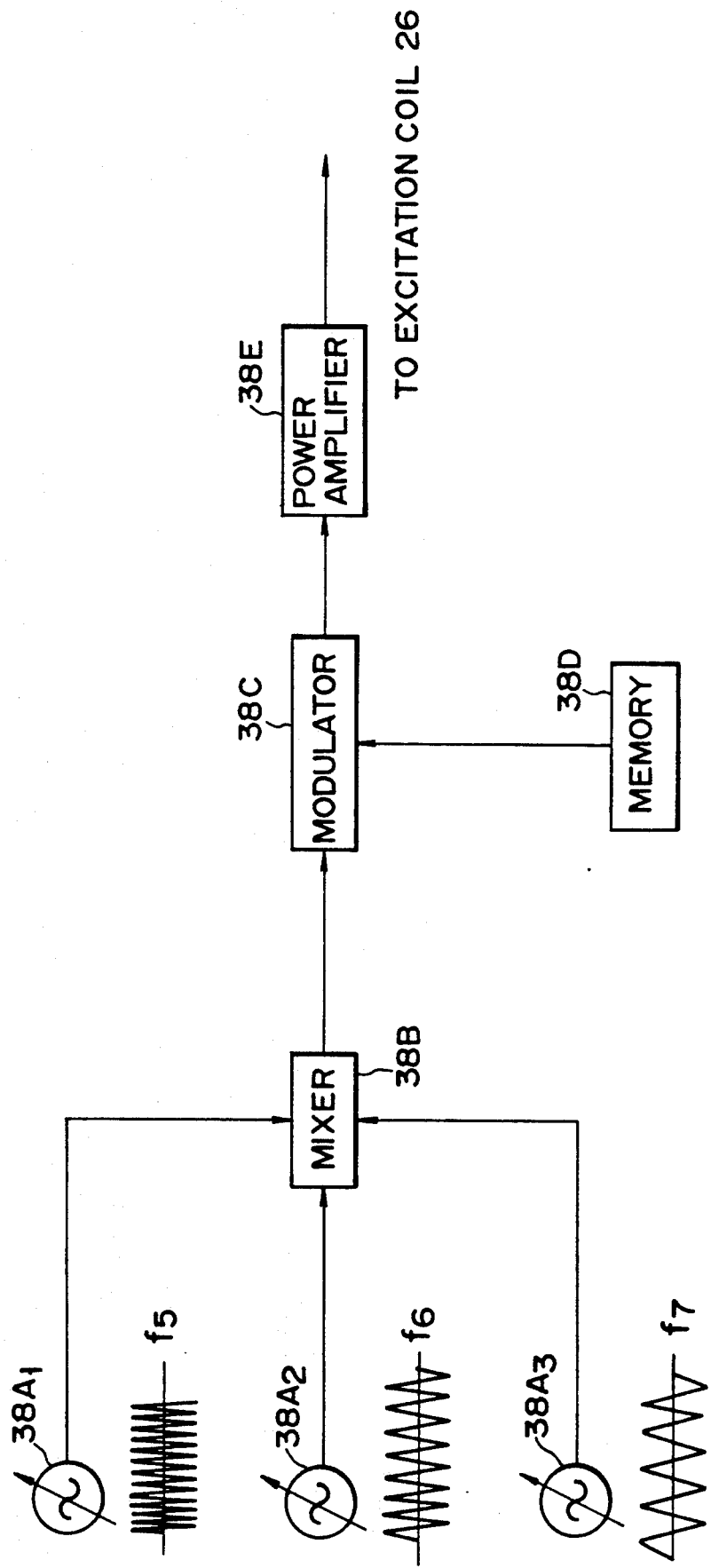
FIG. 13 is a block diagram showing in detail an arrangement of the second embodiment of a magnetic resonance imaging apparatus for practicing the method of the third embodiment of the method of the present invention.

In the method of the third embodiment, an artery 102 and a vein 104 are present along the body axis of an object 100 to be examined, as shown in FIG. 11A. A slice region H6 perpendicular to the body axis of the object 100 is the data acquisition region. Thus, the artery 102 and the vein 104 intersect with the data acquisition region H6. Slice regions H5 and H7 are set as non-signaled regions in order to acquire an MR signal free from the influence of the blood flow from the data acquisition region H6. The slice regions H5 and H7 are set on the two sides of the data acquisition region H6. A pulse sequence shown in FIG. 12 is executed to excite the slice regions H5, H6, and H7. Carriers having center frequencies f5, f6, and f7 are needed, as in the method of the first embodiment. A mixed 90° RF pulse P5 and a mixed 180° RF pulse P6 are needed, as shown in FIG. 12. Except for them, the third embodiment is the same as the embodiment shown in FIG. 5. First, second, and third variable frequency oscillators 38A1, 38A2, and 38A3 are needed, as shown in FIG. 13, to obtain the mixed 90° RF pulse P5 and the mixed 180° RF pulse P6. Except that, the third embodiment is the same as the embodiment shown in FIG. 3. The first variable frequency oscillator 38A1 generates a first carrier F5 having a center frequency f5 and a frequency band $\Delta f$. The second variable frequency oscillator 38A2 generates a second carrier F6 having a center frequency f6 and a frequency band $\Delta f$. The third variable frequency oscillator 38A3 generates a third carrier F7 having a center frequency f7 and a frequency band $\Delta f$. A mixed carrier is obtained by a mixer 38B. A modulator 38C modulates the mixed carrier with a SINC function wave. A power amplifier 38E amplifies the power of the modulated wave and supplies it to a transmission coil 24.

As shown in FIG. 12, in the period ST1, a mixed RF pulse P5 having a flip angle of 90° and a slicing gradient field GS are applied to the object 100. The object 100 is placed inside the magnet assembly 20 of FIG. 2 and set in the static magnetic field. When the RF pulse P5 is applied to the object 100, the separated slice regions H5, H6, and H7 having thicknesses $\Delta h$ are excited, as shown in FIG. 11B. The regions H5, H6, and H7 intersect with the artery 102 and the vein 104 in which the blood flows. The region H5 consists of a non-intersecting region HA5 and intersecting regions HB5 and HC5. The region H6 consists of a non-intersecting region HA6 and intersecting regions HB6 and HC6. The region H7 consists of a non-intersecting region HA7 and intersecting regions HB7 and HC7. In FIGS. 11A to 11C, the slicing gradient magnetic field GS is a Z-axis gradient magnetic field GZ so that the sections of the object 100 perpendicular to the body axis become the regions H5, H6, and H7. During the period ST2, an encoding gradient magnetic field GE is applied to the object 100. The encoding gradient magnetic field GE is a Y-axis gradient magnetic field GY in FIGS. 11A to 11C. During the period ST3, a mixed RF pulse P6 having a flip angle of 180° and a slicing gradient magnetic field GS are applied to the object 100. During the period ST4, a read gradient magnetic field GR for acquiring an MR signal and a slicing gradient magnetic field GS having a low magnetic field intensity for separating the MR signal into the regions H5, H6, and H7 are applied to the object 100. As a result, MR signals are induced from the regions H5, H6, and H7. However, the detection coil 24 acquires the MR signal from only the region H6. In this case, the region H6 consists of the initial non-intersecting region HA6, the intersecting region HB5 added from the region H7, and the intersecting region HC7 added from the region H7, as shown in FIG. 11C. The region H6 consists of the initial non-intersecting region HA6, the intersecting region HB5 added from the region H5, and the intersecting region HC7 added from the region H7. The region H7 consists of the initial non-intersecting region HA7, the intersecting region HB6 added from the region H6, and a newly added intersecting region HD2. The initial intersecting region HB7 of the region H7 is shifted downstream, and the initial intersecting region HC5 of the region H5 is shifted downstream. These phenomena are caused because the blood flows in the artery 102 at a rate v1. Thus, a distance L1 between the regions H5 and H6 is substantially specified by v1×T where T is the time started with application of the initial RF pulse P5 and terminated with acquisition of the MR signal. When the blood flows in the vessel 104 at a rate v2, a distance L2 between the regions H6 and H7 is substantially specified by v2×T where T is the time started with application of the initial RF pulse P5 and terminated with acquisition of the MR signal. Note that the read gradient magnetic field GR is an X-axis gradient magnetic field in FIGS. 11A to 11C.

From the foregoing, in the region H6, an MR signal is induced in the initial non-intersecting region HA6 whereas it is not in the intersecting region HB5 added from the region H5 and in the intersecting region HC7 added from the region H7. As a result, the magnetization axes of the blood flows in the intersecting regions HB5 and HC7 are inverted through 180°, and thus the lateral magnetization components of the blood flows of the intersecting regions HB5 and HC7 are substantially decreased. Then, the detection coil 24 acquires MR signals from only the non-intersecting region HA6. In other words, the intersecting regions HB5 and HC7 are non-signaled.

When an MR signal is to be read, a weak slicing gradient magnetic field GS is applied in addition to the read gradient magnetic field GR, as shown in FIG. 12, in order to discriminate the MR signals from the regions H5, H6, and H7, as shown in FIG. 7.

In this manner, according to this embodiment, an MR image of the region H6 free from the influence of the blood flow can be obtained. In other words, a good MR image having few artifacts can be obtained. In addition, the application timings of the 90° and 180° pulses P5 and P6 are the same as those of the spin echo scheme. The only difference between this method and the spin echo scheme is that, in this embodiment, each of the 90° and 180° pulses P5 and P6 includes three carriers. The time required for data acquisition is the same as that of the spin echo scheme. This contributes to shortening of the scanning time.

Each of the first, second, and third imaging methods described above has a single slice region as an imaging target. However, when a multi-slice scheme is used, they can have a plurality of slice regions as the imaging target.

FIG. 14 schematically shows the fourth embodiment of a magnetic resonance imaging method according to the present invention and is an application example of the first embodiment which utilizes the multi-slice scheme. An artery or vessel 102 is present in an object 100 to be examined. In this fourth embodiment as well, data acquisition regions and non-signaled regions are combined. More specifically, slice regions H10, H11, H12, H13, H14, H15, H16, ... are set in the object 100. Slice images I11, I12, I13, ... can be reconstructed by a combination C11 of the data acquisition region H14 and the non-signaled region H12, a combination C12 of the data acquisition region H14 and the non-signaled region H12, a combination C13 of the data acquisition region H16 and the non-signaled region H14, and the like. Slice images I21, I22, I23, ... can be reconstructed by a combination C21 of the data acquisition region H13 and the non-signaled region H11, a combination C22 of the data acquisition region H15 and the non-signaled region H13, a combination of the data acquisition region H17 and the non-signaled region H15, and the like. It is obvious that the method of the fourth embodiment can be realized even if the multi-slice scheme is not utilized but by sequentially moving a single slice image of the method of the first embodiment.

Figure 15:
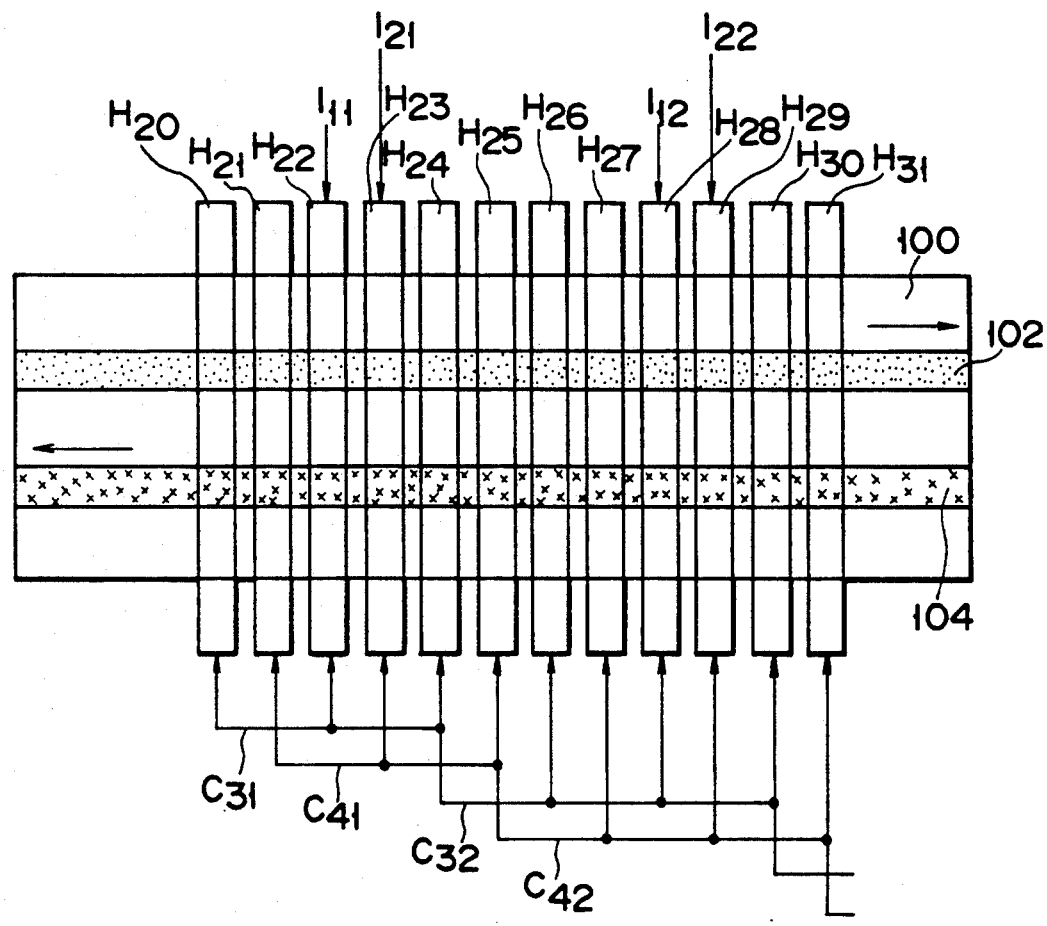
FIG. 15 is a schematic view showing the fifth embodiment of a magnetic resonance imaging method according to the present invention by way of the relationship between the data acquisition region and the non-signaled regions.

FIG. 15 schematically shows the fifth embodiment of a magnetic resonance imaging method according to the present invention and is an application example of the third embodiment which utilizes the multi-slice scheme. An artery 102 and a vessel 104 are present in an object 100 be examined. In this fifth embodiment as well, data acquisition regions and non-signaled regions are combined. More specifically, slice regions H20, H21, H22, H23, H24, H25, H26, H27, H28, H29, H30, ... are set in the object 100. Slice images I11, I12, ..., I21, I22, ... can be reconstructed by a combination C31 of the data acquisition region H22 and the non-signaled regions H20 and H24, a combination C32 of the data acquisition region H26 and the non-signaled regions H24 and H28, a combination C41 of the data acquisition region H23 and the non-signaled regions H21 and H25, a combination C42 of the data acquisition region H29 and the non-signaled regions H27 and H31, and the like. It is obvious that the method of the fifth embodiment can be realized even if the multi-slice scheme is not utilized but by sequentially moving a single slice image of the method of the third embodiment.

Any one of the imaging methods described above is based on the spin echo scheme. However, an imaging method based on a field echo scheme or an inversion recovery scheme as a high-speed imaging method or an echo planar scheme as an ultrahigh-speed imaging method can be utilized in the first to fifth embodiments.

Figure 16:
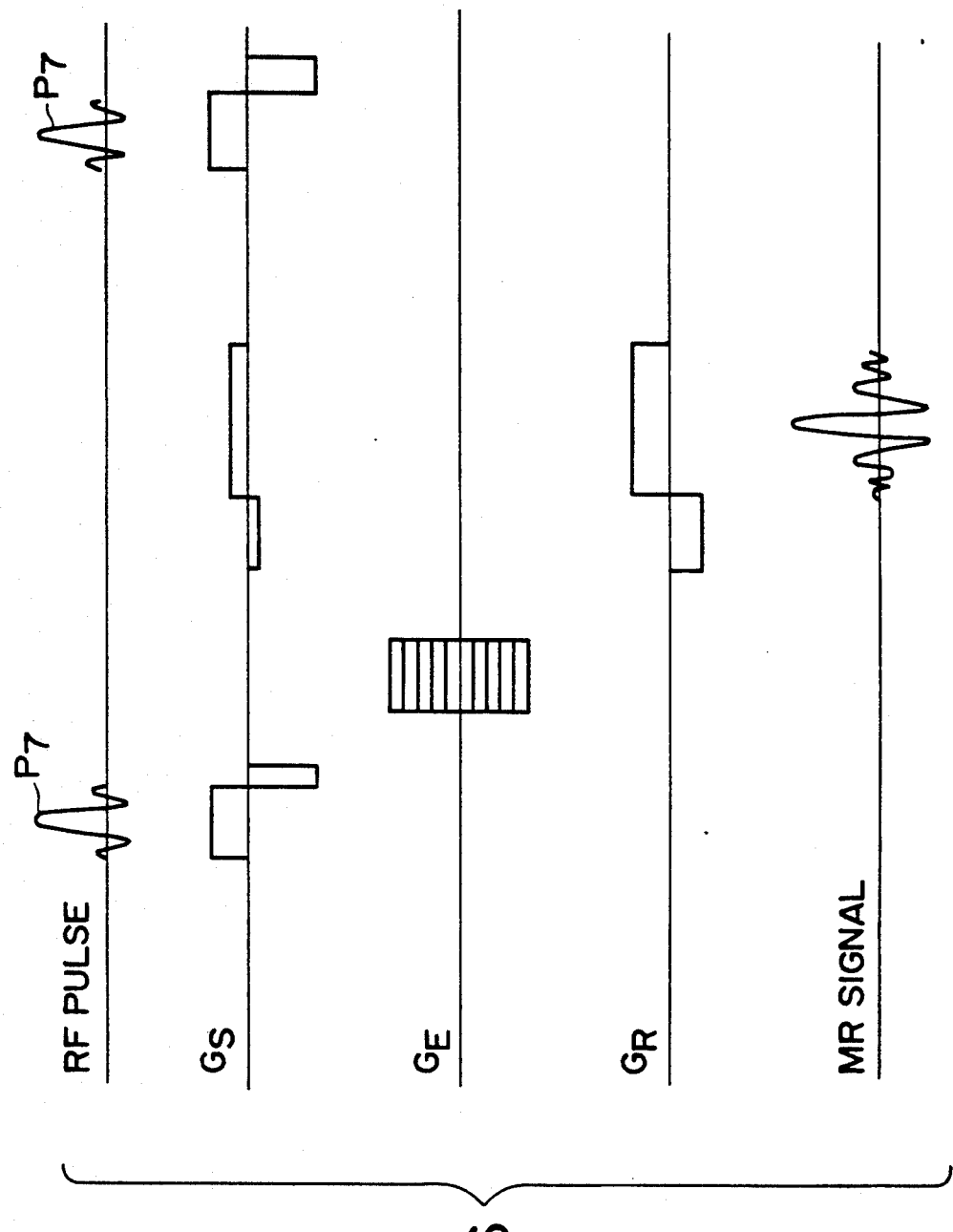
FIG. 16 is a timing waveform chart showing a field echo scheme which is another example of the basic pulse sequence with which any one of the first to fifth embodiments of the magnetic resonance imaging methods according to the present invention can be practiced.

FIG. 16 shows the field echo scheme. Referring to FIG. 16, reference symbol P7 denotes an RF pulse having a flip angle of α°. FIG. 17 shows the inversion recovery scheme. Referring to FIG. 17, reference symbol P8 denotes an RF pulse having a flip angle of 180°; P9, an RF pulse having a flip angle of 90°; and P10, an RF pulse having a flip angle of 180°. FIG. 18 shows the echo planar scheme based on the spin echo scheme. Referring to FIG. 18, reference symbol P11 denotes an RF pulse having a flip angle of 90° ; and P12, an RF pulse having a flip angle of 180°. FIG. 19 shows the echo planar scheme based on the field echo scheme.

Figure 20:
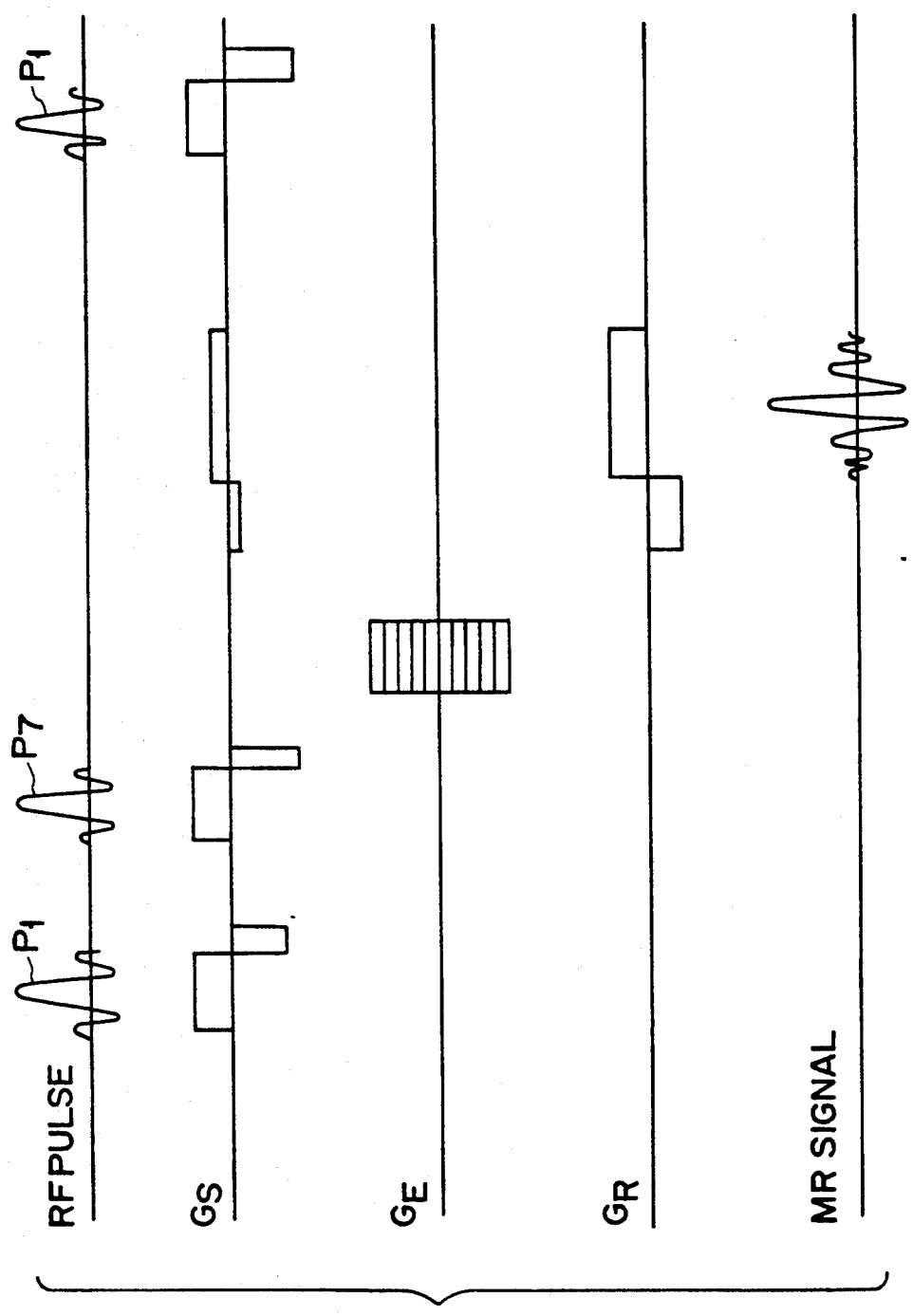
FIG. 20 is a timing waveform chart of a pulse sequence for practicing the third embodiment of the method of the present invention shown in FIGS. 11A, 11B, 11C, 12, and 13 by utilizing the field echo scheme.

FIG. 20 is a timing waveform chart showing a pulse sequence for practicing the method of the third embodiment shown in FIGS. 11A, 11B, 11C, 12, and 13 by utilizing the field echo scheme. An RF pulse P7 is obtained by only inverting the magnetization axis of the blood flow through a flip angle of α°, i.e., about 90°. Thus, an MR signal becomes as small as negligible in a blood flowing in the imaging target area. As a result, an MR image of the imaging target area free from the influence of the blood flow can be obtained.

Additional advantages and modifications will readily occur to those skilled in the art. Therefore, the invention in its broader aspects is not limited to the specific details, representative devices, and illustrated examples shown and described herein. Accordingly, various modifications may be without departing from the spirit or scope of the general inventive concept as defined by the appended claims and their equivalents.

What is claimed is:

1. A magnetic resonance imaging method comprising:
   a first step of causing magnetic resonance excitation of first and second regions which intersect with a blood vessel of an object to be examined simultaneously, the second region being separated from the first region by a predetermined distance and not intersecting with the first region;

a second step of acquiring a magnetic resonance signal from only the second region, the second step being executed after the first step; and a third step of performing image reconstruction processing of the magnetic resonance signal acquired in the second step in order to obtain a tomographic image of the second region.

2. A method according to claim 1, wherein the first step comprises using a mixed carrier obtained by mixing a first carrier corresponding to the first region and a second carrier corresponding to the second region.

3. A method according to claim 2, wherein the mixed carrier is modulated with a SINC function waveform in order to generate an exciting radio frequency pulse magnetic field.

4. A method according to claim 1, wherein the second step includes a step of applying a slicing gradient magnetic field for separating a magnetic resonance signal induced from the first region and a magnetic resonance signal induced from the second region.

5. A method according to claim 1, wherein the magnetic resonance signal from the second region is a spin echo magnetic resonance signal.

6. A method according to claim 1, wherein the magnetic resonance signal from the second region is a field echo magnetic resonance signal.

7. A method according to claim 1, wherein the second region is an inversion recovery magnetic resonance signal.

8. A method according to claim 1, wherein the second region is an echo planar magnetic resonance signal.

9. A method according to claim 1, wherein the first, second, and third steps are executed while sequentially changing an order of the first and second regions in order to obtain a plurality of images.

10. A magnetic resonance imaging method comprising:

a first step of causing magnetic resonance excitation of first and second regions of an object to be examined simultaneously, the second region including a blood vessel, wherein said second region intersects with the first region;

a second step of acquiring a magnetic resonance signal from the second region and a part of the first region intersecting with the second region, the second step being executed after the first step; and a third step of performing image reconstruction processing of the magnetic resonance signal acquired in the second step in order to obtain a tomographic image of the second region.

11. A method according to claim 10, wherein the first step comprises using a carrier to be modulated including a first carrier corresponding to the first region at a first half thereof and a second carrier corresponding to the second region at a second half thereof.

12. A method according to claim 11, wherein the carrier to be modulated is modulated with a SINC function waveform in order to generate an exciting radio frequency pulse magnetic field.

13. A magnetic resonance imaging method comprising:

a first step of causing magnetic resonance excitation of at least first and second regions of first, second and third regions of an object to be examined simultaneously, the second region intersecting with a blood vessel, separated from the first region by a predetermined distance and not intersecting with the first region, the third region being separated from the second region and intersecting with neither the first nor second regions;

a second step of acquiring a magnetic resonance signal from only the second region, the second step being executed after the first step; and a third step of performing image reconstruction processing of the magnetic resonance signal acquired in the second step in order to obtain a tomographic image of the second region.

14. A method according to claim 12, wherein the first step comprises using a mixed carrier as a mixture of at least a first carrier corresponding to the first region and a third carrier corresponding to the third region.

15. A method according to claim 14, wherein the mixed carrier is modulated by a SINC function waveform in order to generate an exciting radio frequency pulse magnetic field.

16. A method according to claim 13, wherein the second step includes a step of applying a slicing gradient magnetic field in order to separate a magnetic resonance signal induced from the first region and the magnetic resonance signal induced from the second region.

17. A method according to claim 13, wherein said magnetic resonance signal from the second region is a spin echo magnetic resonance signal.

18. A method according to claim 13, wherein said magnetic resonance signal from the second region is a field echo magnetic resonance signal.

19. A method according to claim 13, wherein said magnetic resonance signal from the second region is an inversion recovery magnetic resonance signal.

20. A method according to claim 15, wherein said magnetic resonance signal from the second region is an echo planar magnetic resonance signal.

21. A method according to claim 13, wherein the first, second, and third steps are executed while sequentially changing an order of the first and second regions in order to obtain a plurality of images.

* * * * *